(12) United States Patent
Rhode et al.

(10) Patent No.: US 7,532,080 B2
(45) Date of Patent: *May 12, 2009

(54) LC OSCILLATOR CIRCUIT WITH A COMPENSATION COIL FOR PARASITICAL COLLECTOR CAPACITOR

(75) Inventors: Ulrich L. Rhode, Upper Saddle River, NJ (US); Klaus Danzeisen, Graefelfing (DE)

(73) Assignee: Synergy Microwave Corporation, Paterson, NJ (US)

( * ) Notice: Subject to any disclaimer, the term of this patent is extended or adjusted under 35 U.S.C. 154(b) by 385 days.

This patent is subject to a terminal disclaimer.

(21) Appl. No.: 11/459,088

(22) Filed: Jul. 21, 2006

(65) Prior Publication Data

US 2006/0284695 A1 Dec. 21, 2006

Related U.S. Application Data

(62) Division of application No. 10/332,656, filed as application No. PCT/EP00/07578 on Aug. 4, 2000, now Pat. No. 7,102,453.

(51) Int. Cl.
H03B 5/04 (2006.01)

(52) U.S. Cl. .................... 331/117 R; 331/167

(58) Field of Classification Search ............. 331/117 R, 331/167, 117 FE
See application file for complete search history.

(56) References Cited

U.S. PATENT DOCUMENTS

| 4,692,718 | A | 9/1987 | Roza et al. |
| 5,144,263 | A | 9/1992 | Fenk |
| 5,144,264 | A | 9/1992 | Chong et al. |
| 5,731,745 | A | 3/1998 | Parham |
| 5,821,820 | A | 10/1998 | Snider et al. |
| 6,046,647 | A | 4/2000 | Nelson |
| 6,066,991 | A | 5/2000 | Naito et al. |
| 6,075,421 | A | 6/2000 | Chong |
| 6,091,309 | A | 7/2000 | Burke et al. |

FOREIGN PATENT DOCUMENTS

| DE | 28 10 734 | 1/1981 |
| DE | 35 13 403 | 10/1986 |

*Primary Examiner*—Joseph Chang
(74) *Attorney, Agent, or Firm*—Lewis, Rice & Fingersh, L.C.

(57) ABSTRACT

An oscillator circuit configuration comprising in an LC-parallel oscillatory circuit and a transistor as an amplifying element. A compensating winding is associated with the parallel oscillatory circuit whereby the collector voltage of the transistor is fed to said winding in order to compensate the effect of the parasitic collector capacity. Preferably, the collector current from the transistor is maintained constant be an amplifier.

9 Claims, 2 Drawing Sheets

LC OSCILLATOR CIRCUIT WITH A COMPENSATION COIL FOR PARASITICAL COLLECTOR CAPACITOR

CROSS REFERENCE TO RELATED APPLICATION(S)

This application is a Divisional of and claims priority to U.S. Utility patent application Ser. No. 10/332,656, filed Apr. 1, 2003, now U.S. Pat. No. 7,102,453 which is a §371 National Phase Application of PCT Application Ser. No.: PCT/EP00/07578 filed Aug. 4, 2000 which is turn claims priority to German Patent Application Ser. No,: 100 33 741.4 filed Jul. 12, 2000. The entire disclosure of all these documents is herein incorporated by reference.

BACKGROUND OF THE INVENTION

1. Field of the Invention

The invention relates to an oscillator circuit with an LC-parallel resonant circuit and a transistor (T1) as amplifier element.

2. Description of the Prior Art

Oscillator circuits with LC-parallel resonant circuits with different types of feedback circuits are known. An example of these is the so-called Colpitts oscillator, in which the feedback circuit between the amplifier element consisting of one or several bipolar or field effect transistors and the LC-parallel resonant circuit results from splitting the capacitance of the resonant circuit into two capacitors functioning at the end of the inductor of the resonant circuit. A problem with such oscillator circuits is temperature fluctuation, variations in frequency response as well as amplitude noise and phase noise resulting from this. These fluctuations can normally be attributed to changes in the operating point of the amplifier element.

SUMMARY

It is therefore the object of the invention to provide an oscillator circuit, in which the operating point can be kept constant by simple means, in order to prevent the temperature, frequency and amplitude fluctuations mentioned.

This object is achieved, based on an oscillator circuit according to the preamble of the main claim, through the characteristic features of this. Advantageous further developments follow from the sub-claims.

As a result of the additional compensation coil on the parallel resonant circuit, the interfering effect of the parasitical collector capacitance, which on the one hand consists of internal capacitance of the semi-conductor and possibly also capacitance of the housing and remaining structure, is compensated, thus no longer acting in parallel with the inductor of the parallel resonant circuit and as a result changing the frequency dependent on operating point. As a result of the measure according to the invention a change in frequency is thus prevented by changing the parasitical collector capacitance of the amplifier element and therefore an oscillator with high spectral purity is created.

In the case of Colpitts oscillators, the bipolar amplification transistor of which is operated in the collector circuit and the collector of which is earthed, although the parasitical collector capacitance acts without being amplified on the inductor of the parallel resonant circuit, the measure according to the invention is also advantageous in the case of such oscillator circuits. Particularly advantageous is the measure according to the invention however in the case of such oscillator circuits, for example Colpitts oscillators, in which the output signal is decoupled at the collector of the amplification transistor and therefore the collector is no longer earthed. The parasitical collector capacitance in this case is multiplied with the amplification coefficient on the collector and therefore increased many times over at the inductor of the parallel resonant circuit. However, it can be very easily suppressed according to the invention.

Another possibility for stabilizing the operating point and therefore for preventing temperature, frequency and amplitude fluctuations is to keep the collector current of the transistor constant with a controlled gain amplifier. This measure is especially advantageous in combination with an oscillator circuit according to claims 1 and 2, but can, however, also be very effective by itself. As a result of such regulation to keep the collector current constant, the operating point of the transistor is kept constant and at the same time AC components close to the carrier which are caused by internal interference sources of the transistor are fully stabilized. By stabilizing the operating point it is also possible to prevent any changes in current conduction angle in the event of changes in frequency, which in turn would affect the operating point. As a result of stabilizing the operating point in the event the oscillator becomes detuned, the output amplitude of the oscillator changes less than with known circuits, for example only by 1 dB. Not only slow changes are fully stabilized, but also changes over a bandwidth, which ranges from DC up to a limit frequency determined by the controlled gain amplifier, Thus relatively fast changes in the operating point of the transistor can also be fully stabilized and in this way interference modulation can be precluded. Therefore also amplitude noise and also any phase noise possibly produced as a result is reduced. It has proved especially advantageous, both for the amplifier element of the oscillator as well as for the amplifier elements of the control circuit to use transistors of the same type, for example bipolar transistors of the npn-type, which is possible by selecting the topology of the circuit accordingly.

In order to keep the phase noise as low as possible with such oscillator circuits, according to a further development of the invention it is proposed to connect a series resonant circuit in parallel to the base emitter section of the transistor, which is tuned to the doubled oscillator frequency. In this way the modulation of the amplifier element is kept to a minimum with the first harmonic wave of the resonant frequency of the oscillator and therefore also the phase noise. This measure can be used with all usual oscillator circuits, but however preferably in combination either with an oscillator circuit according to claim 1 and/or an oscillator circuit according to claim 3, in order in this way to create optimum operating conditions.

DESCRIPTION OF THE PREFERRED EMBODIMENT(S)

The invention is explained in more detail below by way of the embodiments shown in schematic drawings.

Figure 1:
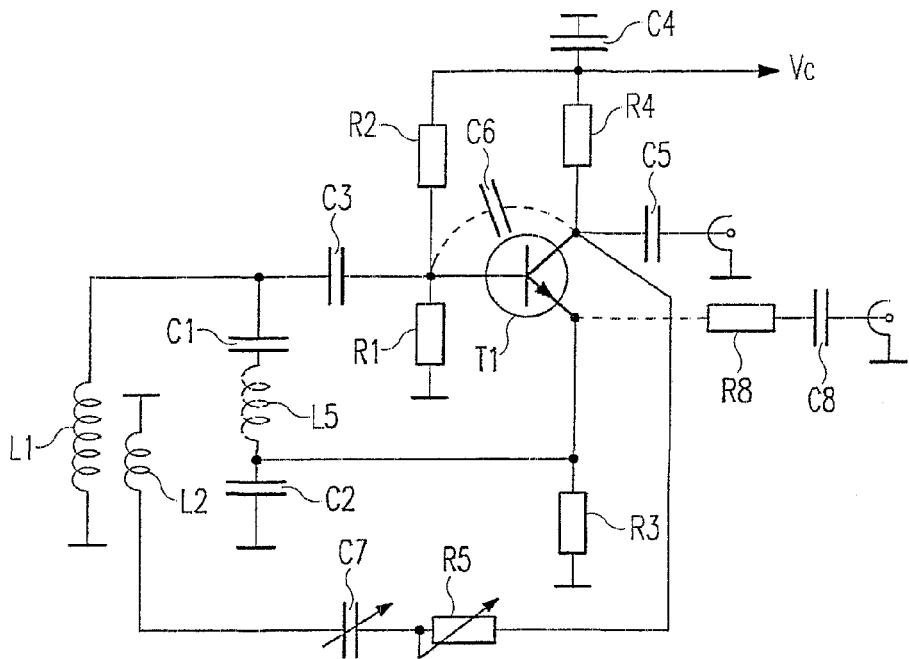
FIG. 1 shows the principle circuit diagram of a Colpitts oscillator with a parallel resonant circuit, consisting of an inductor L1 and the series circuit of two capacitors C1 and C2.

FIG. 1 shows the principle circuit diagram of a Colpitts oscillator with a parallel resonant circuit, consisting of an inductor L1 and the series circuit of two capacitors C1 and C2. A transistor T1 is used as an amplifier element, in the embodiment shown a bipolar npn-transistor. The resonant frequency of the oscillator is determined by L1 and C1/C2. The operating point of the oscillator T1 is determined by the resistors R1, R2 and R3, through which also the supply voltage $V_c$ is applied. If the output frequency is decoupled via the capacitor C5 on the collector of the transistor T1, a resistor R4 determining the output resistance is provided between collector and the capacitor C4. If decoupling occurs on the emitter of the transistor, as indicated by a dotted line in FIG. 1 through C8 and R8, this resistor R4 is superfluous and the collector of the transistor T1 is directly earthed via the capacitor C4. The capacitors C3 and C4 are DC electric shock hazard capacitors, C4 is a high capacitance capacitor to suppress low frequency interference noise on the supply voltage $V_c$. Such noise interference could lead to a disturbing modulation of the oscillator frequency.

The parasitical capacitor C6, which consists of an internal amount of semi-conductor capacitance to which an amount of capacitance of the surrounding housing and parts of the remaining structure is added, where appropriate, is of paramount importance. In the event of voltage amplification (decoupling via C5 directly on the collector with resistor R4 between collector and C4) this parasitical capacitor C6 is multiplied on the collector with the amplification coefficient of the transistor T1 and therefore lies more strongly parallel to the inductor L1 and therefore helps to determine the frequency of the oscillator. As a result, the spectral purity of the frequency is also degraded, since this parasitical capacitance portion C6 is also subject to fluctuations which are dependent on the operating point. Although this amplification effect is prevented if the decoupling, as indicated with a dotted line, takes place on the emitter, it nevertheless occurs here to a disturbing extent.

In order to prevent this influence of the parasitical collector capacitor C6, according to the invention an additional compensation coil L2 is allocated to the inductor L1 of the parallel resonant circuit and coupled with this. It is connected via a variable capacitor C7 and a variable resistor R5 with the collector of the transistor T1; by corresponding adjustment of C7 and R5 the collector voltage of the transistor, in that manner regulated according to amount and phase, is fed to the compensation coil L2 in such a way that the described effect of the parasitical collector capacitor C6 is compensated.

Figure 2:
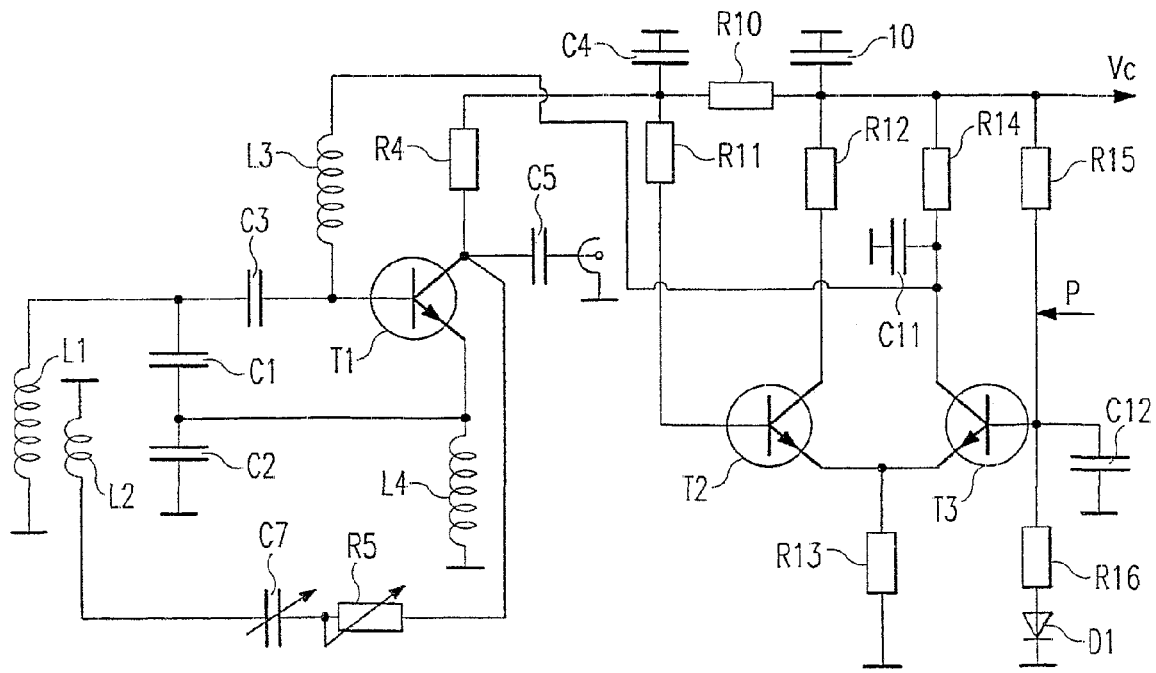
FIG. 2 shows the circuit of a Colpitts oscillator according to FIG. 1, extended by an additional control circuit to keep the DC operating point constant and to fully stabilize AC components close to the carrier, which are caused by internal interference sources of the transistor T1.

FIG. 2 shows the circuit of a Colpitts oscillator according to FIG. 1, extended by an additional control circuit to keep the DC operating point constant and to fully stabilize AC components close to the carrier, which are caused by internal interference sources of the transistor T1. This control circuit, described in more detail below, can also be used without the compensation coil L2 shown in FIG. 1 and is therefore suitable for all usual known oscillator circuits with parallel resonant circuits, but is, however, especially advantageous in combination with a circuit according to FIG. 1.

The oscillator circuit with the parallel resonant circuit and the bipolar transistor T1 corresponds to that according to FIG. 1. In addition a controlled gain amplifier consisting of two transistors T2 and T3 is also provided. On the series circuit of the smaller resistor R4 of, for example, only 50 Ohm and the larger resistor R5 of, for example, 1,000 Ohm the voltage caused by the collector current is fed via a resistor R11 to the base of the first transistor T2. The transistors T2 and T3 have a common emitter resistor R13 and two roughly equal-sized collector resistors R12 and R14 The base of the first transistor T2 is connected via R11 and R4 with the collector of the transistor T1, decoupling again takes place via C5 on the collector of T1. The collector of the second transistor T3 is connected via a coil L3 with the base of the transistor T1. At the base of the second transistor T3 a reference voltage is produced via a voltage splitter R15, R16, the base of the second transistor T3 being earthed AC-wise via the capacitor C12.

This controlled gain amplifier operates as follows: Reduction in the collector current of the transistor T1 causes a rise in the voltage at the base of the transistor T2, as a result the current through the transistor T2 increases. Consequently the voltage on the resistor R13 also increases and as a result the current through the resistor R14 is reduced. Therefore the voltage on the collector of this transistor T3 increases and consequently via L3 the current through the transistor T1 increases. Therefore a stable and temperature-independent DC state on the transistor T1 ensues, the operating point thus being stabilized. In addition, a changing current conduction angle can no longer alter the operating point of the oscillator in the event of changes in frequency. As a consequence of this, the output amplitude of the oscillator also changes less if it becomes detuned, e.g., only by 1 dB compared to known oscillators. This applies not only for slow fluctuations, but over a bandwidth, which ranges from DC up to a frequency which is determined by the resistor R14 and the capacitor C11. Therefore relatively fast changes in the operating point of the transistor T1, which otherwise would lead to interference modulation, including amplitude noise and phase noise produced as a result, can also be prevented.

The capacitor C12 ensures that the thermal noise of the resistors R15 and R16 does not affect the circuit unfavorably. For the same reason the basic current is fed to the transistor T1 via an inductor.

The controlled gain amplifier possesses through its transistors a more or less pronounced temperature dependence, which influences the reference voltage on the base of the transistor T3. In order to prevent this, it can be advantageous to design the voltage splitter R15, R16 itself correspondingly dependent on temperature and for example to connect a diode D1 in series to the resistor R16. Therefore, a possible temperature dependence of the transistor T1 can also be compensated by suitable choice of the temperature characteristic of this diode D1.

By stabilizing the operating point via the control circuit the resistor R3 according to FIG. 1 can be omitted and according to FIG. 2 replaced by a preferably printed inductor L4; in this way a further source of noise (thermal noise of the resistor R3) can be precluded.

Instead of bipolar transistors, field effect transistors can also be used; in this case however again a resistor R1 according to FIG. 1 must be provided on the transistor T1, which can be omitted in the case of the current-controlled transistor T1 according to FIG. 2

It is advantageous to select the topology of the circuit so that equally technologically effective component parts can be used and the entire oscillator circuit can be designed in a simpler way as an integrated switching circuit. For this purpose for example it is advantageous in FIG. 2 to design all the transistors T1, T2 and T3 as bipolar npn transistors.

Figure 3:
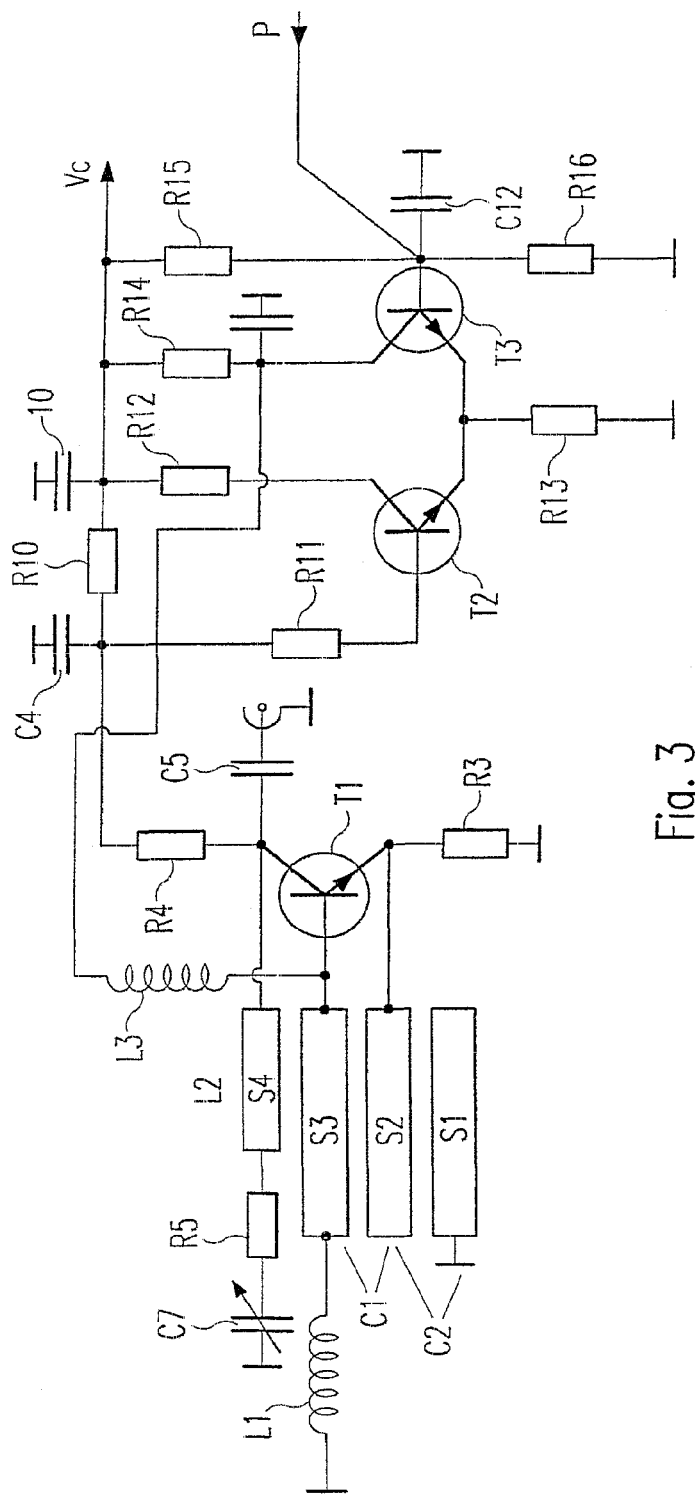
FIG. 3 shows the oscillator part of the circuit according to FIG. 2 in a possible configuration for higher frequencies.

FIG. 3 shows the oscillator part of the circuit according to FIG. 2 in a possible configuration for higher frequencies. The capacitors C1 and C2 in this example are designed as coupled planar microstrips S1, S2, S3, which are installed in predetermined gaps parallel to one another in printed circuit technology on the top of a (not illustrated) circuit board. They function in the known way as coplanar coupled microstrip conductors and with suitable dimensioning of their length and breadth replace the discrete capacitors C1 and C2, which are not easy to handle at high frequencies in traditional design, are difficult to realize in small values and are in most cases not generally available as variable capacitors. The capacitance values of such coupled coplanar microstrips can be easily calculated and optimized by means of suitable CAD programs; they can also be easily adjusted and production tolerances are minimal. In addition the manufacture of such capacitors is very cost-effective.

Also the compensation coil L2 according to FIG. 3 can easily be made from such a coupled planar microstrip S4, which is arranged in the gap parallel to the microstrip S3 forming the capacitor C1 and is coupled via C1 with L1.

Figure 4:
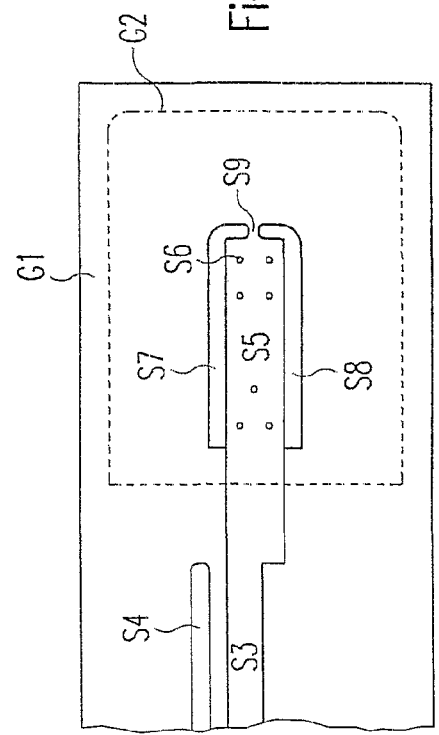
FIG. 4 shows the frequency determining inductor L1 of the parallel resonant circuit made in conductor technology and on the same circuit board in printed circuit technology.

Also the frequency determining inductor L1 of the parallel resonant circuit can easily be made in conductor technology on the same circuit board in printed circuit technology, as FIG. 4 shows. Opposing microstrips S5 are laid on a substrate G1 on the top and bottom in extension of the microstrip S3 forming the capacitor C1, which are then galvanically connected with one another via several distributed feedthroughs S6. On the side parallel to these microstrips S5 the insulator of the circuit board G1 is machined out in the form of slits S7 and S8, while there only remains a narrow bridge of material S9 at the end of the microstrip S5, which mechanically supports the otherwise free-lying microstrip S5 on the front end and therefore prevents mechanical resonance of this part. The circuit board G1 is installed in a closed housing G2 illustrated diagrammatically and the free-lying conductor piece S5 therefore acts as conductor resonator. This resonator S5 is dimensioned (length, breadth, thickness) in the known way according to the dimensioning standards laid down for shell circuits, since the resonator S5 in the housing G2 is nothing more than a normal shell circuit. By designing the parallel resonant circuit in this way, high intrinsic quality is achieved and therefore an essential improvement in the phase noise of the oscillator.

If the frequency of the parallel resonant circuit has to be determined by capacitance diodes with maximum achievable quality, it must be ensured that the number of the capacitance diodes is also chosen for optimum quality. Optimum quality is only achieved if either only a single capacitance diode is used or two n-pairs of anti-parallel connected capacitance diodes, n needing to be greater than 1 and the quality increasing with the number of such capacitance diode pairs connected in series.

Oscillators of the type described are often used in phase regulation loops, in which the oscillator frequency in a phase detector is compared with a reference frequency of a high quality reference oscillator (for example quartz oscillator). In these cases it can happen that the noise of the reference frequency is higher than that of the oscillator circuit, namely when reference frequency noise close to the carrier is over multiplied above the division coefficient of an intermediate frequency splitter. As a result the oscillator circuit is then degraded in respect to phase noise. In order to prevent this, it can be advantageous to feed the noise on the control line via a suitable low frequency filter, for example a low pass filter, into the control circuit according to FIG. 2, as indicated diagrammatically in FIG. 2 via the control line P. Such interfering noise signals on the control line in the oscillator can again be fully stabilized via this control signal derived from the control line and therefore the increase in phase noise mentioned can be compensated.

To reduce the phase noise it is advantageous to keep the modulation of the amplifier element T1 in the case of frequencies above the oscillator frequency as low as possible. This can be achieved by connecting a series resonant circuit in parallel to the base emitter section of the transistor T1, which is tuned to the first harmonic wave of the oscillator frequency, as indicated with a dotted line in FIG. 1 by the additional coil L5 connected in series to the capacitor C1. Since the first harmonic wave generally has the greatest amplitude after the base wave, as a result an improvement in the phase noise of approx. 6 dB can be achieved. In the case of the Colpitts oscillator shown in FIG. 1 the one capacitor C1 can also be exploited for this additional series resonant circuit, in the case of other oscillator Circuits, in which no such splitting of the resonant circuit capacitance into two capacitors C1, C2 connected in series takes place; this additional series resonant circuit with series resonance $2f$ can be arranged additionally between base and emitter of the transistor T1. The inductor L5 is again preferably realized in printed stripline technology.

The invention claimed is:

1. An oscillator circuit with an LC-parallel resonant circuit and a transistor as amplifier element;
   characterized in that
   a compensation coil, to which the collector voltage of the transistor is fed in a direction compensating the effect of the parasitical collector capacitor, is allocated to the parallel resonant circuit;
   wherein the collector voltage is fed to the compensation coil via the series circuit of a variable capacitor and a variable resistor regulated according to amount and phase so that it is opposed to the effect of the parasitical collector capacitor.

2. An oscillator circuit with an LC-parallel resonant circuit and a transistor as amplifier element;
   characterized in that
   a compensation coil, to which the collector voltage of the transistor is fed in a direction compensating the effect of the parasitical collector capacitor, is allocated to the parallel resonant circuit;
   wherein at least some of the capacitors used consist of coupled coplanar microstrips.

3. An oscillator circuit with an LC-parallel resonant circuit and a transistor as amplifier element;
   characterized in that
   a compensation coil, to which the collector voltage of the transistor is fed in a direction compensating the effect of the parasitical collector capacitor, is allocated to the parallel resonant circuit;
   wherein said LC-parallel resonant circuit is designed in stripline technology as a conductor resonator.

4. The circuit of claim 3 wherein said conductor resonator consists of a circuit board arranged inside a closed housing on the top and bottom of which identical microstrips are laid, which are then galvanically connected with one another by feedthroughs and along their edges longitudinal slits are machined out in the circuit board.

5. An oscillator circuit with an LC-parallel resonant circuit and a transistor as amplifier element;
   characterized in that
   a compensation coil, to which the collector voltage of the transistor is fed in a direction compensating the effect of the parasitical collector capacitor, is allocated to the parallel resonant circuit;
   wherein said LC-parallel resonant circuit can be tuned in the frequency via at least one capacitance diode connected in parallel to the inductor, whereby either only a single capacitance diode or 2n capacitance diode pairs in each case consisting of two anti-parallel connected capacitance diodes and connected in series are provided where n equals an integer greater than 1.

6. An oscillator circuit with an LC-parallel resonant circuit and a transistor as amplifier element;

characterized in that a compensation coil, to which the collector voltage of the transistor is fed in a direction compensating the effect of the parasitical collector capacitor, is allocated to the parallel resonant circuit;

wherein said oscillator circuit is used as a phase-regulated oscillator and its output voltage is compared in a phase detector with a reference frequency, whereby the control signal is fed to the control loop via a filter in the controlled gain amplifier keeping the collector current of the oscillator-transistor constant and to be precise in a direction fully stabilizing any noise on the control loop.

7. An oscillator circuit with an LC-parallel resonant circuit and a transistor as amplifier element;

characterized in that a compensation coil, to which the collector voltage of the transistor is fed in a direction compensating the effect of the parasitical collector capacitor, is allocated to the parallel resonant circuit;

further comprising a series resonant circuit tuned to the doubled oscillator frequency connected in parallel to the base emitter section of the transistor.

8. The circuit of claim 7 wherein;

said oscillator circuit comprises a Colpitts oscillator, in which the feedback between the emitter of the transistor and the LC-parallel resonant circuit results from splitting a resonant circuit capacitance into two capacitors connected in series; and said series resonant circuit is formed by an inductor connected in series to one of said resonant circuit capacitors.

9. The circuit of claim 8 wherein said inductor of the series resonant circuit is designed in stripline technology.

* * * * *

UNITED STATES PATENT AND TRADEMARK OFFICE
CERTIFICATE OF CORRECTION

PATENT NO.         : 7,532,080 B2
APPLICATION NO.    : 11/459088
DATED              : May 12, 2009
INVENTOR(S)        : Ulrich L. Rohde et al.

It is certified that error appears in the above-identified patent and that said Letters Patent is hereby corrected as shown below:

On the title page, item [75]: the first listed inventor's name is misspelled. It should be Ulrich L. Rohde.

Signed and Sealed this

Eighteenth Day of August, 2009

David J. Kappos
*Director of the United States Patent and Trademark Office*